United States Patent
Paci et al.

(10) Patent No.: US 11,737,369 B2
(45) Date of Patent: Aug. 22, 2023

(54) METHOD FOR MANUFACTURING AN INTEGRATED MAGNETORESISTIVE SENSOR

(71) Applicant: STMicroelectronics S.r.l., Agrate Brianza (IT)

(72) Inventors: Dario Paci, Vittuone (IT); Marco Morelli, Bareggio (IT); Caterina Riva, Cusago (IT)

(73) Assignee: STMicroelectronics S.r.l., Agrate Brianza (IT)

(*) Notice: Subject to any disclaimer, the term of this patent is extended or adjusted under 35 U.S.C. 154(b) by 0 days.

(21) Appl. No.: 17/343,388

(22) Filed: Jun. 9, 2021

(65) Prior Publication Data

US 2021/0296578 A1    Sep. 23, 2021

Related U.S. Application Data

(62) Division of application No. 16/201,264, filed on Nov. 27, 2018, now Pat. No. 11,063,211, which is a
(Continued)

(30) Foreign Application Priority Data

Dec. 23, 2010    (IT) .......................... TO2010A001050

(51) Int. Cl.
*G11B 5/127*    (2006.01)
*H04R 31/00*    (2006.01)
(Continued)

(52) U.S. Cl.
CPC .............. *H10N 50/01* (2023.02); *B82Y 25/00* (2013.01); *G01R 33/0011* (2013.01);
(Continued)

(58) Field of Classification Search
CPC ......... H01L 43/08; H01L 43/12; H01L 27/22; B82Y 25/00; G01R 33/011;
(Continued)

(56) References Cited

U.S. PATENT DOCUMENTS 5,260,653 A    11/1993    Smith et al.
5,523,687 A    6/1996    Mouchot et al.
(Continued)

FOREIGN PATENT DOCUMENTS

CN    1677068 A    10/2005
CN    101223453 A    7/2008
(Continued)

OTHER PUBLICATIONS

First Office Action for CN 201180059749.8 dated Dec. 31, 2014 (14 pages).
(Continued)

*Primary Examiner* — Paul D Kim
(74) *Attorney, Agent, or Firm* — Crowe & Dunlevy (57) ABSTRACT

An integrated magnetoresistive device includes a substrate of semiconductor material that is covered, on a first surface, by an insulating layer. A magnetoresistor of ferromagnetic material extends within the insulating layer and defines a sensitivity plane of the sensor. A concentrator of ferromagnetic material includes at least one arm that extends in a transversal direction to the sensitivity plane and is vertically offset from the magnetoresistor. The concentrator concentrates deflects magnetic flux lines perpendicular to the sensitivity plane so as to generate magnetic-field components directed in a parallel direction to the sensitivity plane.

5 Claims, 8 Drawing Sheets

Related U.S. Application Data division of application No. 14/938,121, filed on Nov. 11, 2015, now Pat. No. 10,177,306, which is a division of application No. 13/996,922, filed as application No. PCT/EP2011/074045 on Dec. 23, 2011, now Pat. No. 9,442,168.

(51) Int. Cl.

| | |
|---|---|
| *H10N 50/01* | (2023.01) |
| *B82Y 25/00* | (2011.01) |
| *G01R 33/09* | (2006.01) |
| *H10B 61/00* | (2023.01) |
| *H10N 59/00* | (2023.01) |
| *H10N 50/10* | (2023.01) |
| *G01R 33/00* | (2006.01) |
| *G01R 33/02* | (2006.01) |

(52) U.S. Cl.
CPC ..... *G01R 33/0052* (2013.01); *G01R 33/0206* (2013.01); *G01R 33/09* (2013.01); *G01R 33/093* (2013.01); *G01R 33/096* (2013.01); *G01R 33/098* (2013.01); *H10B 61/00* (2023.02); *H10N 50/10* (2023.02); *H10N 59/00* (2023.02)

(58) Field of Classification Search
CPC   G01R 33/0206; G01R 33/0052; G01R 33/09; G01R 33/093; G01R 33/096; G01R 33/098
See application file for complete search history.

(56) References Cited

U.S. PATENT DOCUMENTS

| | | | |
|---|---|---|---|
| 5,532,584 A | 7/1996 | Jeffers et al. | |
| 6,356,068 B1 | 3/2002 | Steiner et al. | |
| 6,869,822 B2 * | 3/2005 | Yagi | H01L 24/29 257/E21.503 |
| 7,033,881 B2 | 4/2006 | Gaidis et al. | |
| 8,483,723 B2 | 7/2013 | Park et al. | |
| 8,486,723 B1 | 7/2013 | Wan et al. | |
| 8,679,895 B2 | 3/2014 | Motz et al. | |
| 9,423,474 B2 * | 8/2016 | Paci | G01R 33/0017 |
| 9,442,168 B2 | 9/2016 | Paci et al. | |
| 9,568,566 B2 | 2/2017 | Paci et al. | |
| 10,288,697 B2 * | 5/2019 | Paci | H01L 43/08 |
| 2004/0008022 A1 | 1/2004 | Viola et al. | |
| 2005/0270020 A1 | 12/2005 | Peczalski et al. | |
| 2006/0255797 A1 | 11/2006 | Taylor et al. | |
| 2009/0027048 A1 | 1/2009 | Sato et al. | |
| 2011/0074406 A1 | 3/2011 | Mather et al. | |
| 2011/0244599 A1 | 10/2011 | Whig et al. | |

FOREIGN PATENT DOCUMENTS

| | | |
|---|---|---|
| CN | 101325210 A | 12/2008 |
| CN | 101438131 A | 5/2009 |
| EP | 2333573 A1 | 6/2011 |

OTHER PUBLICATIONS

International Search Report and Written Opinion dated Feb. 7, 2012 from corresponding International Application No. PCT/EP2011/074045.

IT Search Report and Written Opinion for IT Appl. No. TO2010A001050 dated Aug. 16, 2011 (9 pages).

\* cited by examiner

METHOD FOR MANUFACTURING AN INTEGRATED MAGNETORESISTIVE SENSOR

CROSS REFERENCE TO RELATED APPLICATIONS

This application is a divisional application from U.S. application for patent Ser. No. 16/201,264 filed Nov. 27, 2018, now U.S. Pat. No. 11,063,211, which is a divisional application from U.S. patent application Ser. No. 14/938,121 filed Nov. 11, 2015, now U.S. Pat. No. 10,177,306, which is a divisional application from U.S. patent application Ser. No. 13/996,922 filed Jul. 29, 2013, now U.S. Pat. No. 9,442,168, which is a U.S. National Stage patent application claiming the benefit of International patent application number PCT/EP2011/074045, filed Dec. 23, 2011, which claims the priority benefit of Italian patent application number TO2010A001050, filed Dec. 23, 2010, which applications are hereby incorporated by reference to the maximum extent allowable by law.

TECHNICAL FIELD

The present disclosure relates to an integrated magnetoresistive sensor, in particular a three-axis magnetoresistive sensor, and to the manufacturing process thereof. In the following description, particular reference will be made to an anisotropic magnetoresistive (AMR) sensor, without, however, being limited thereto, and embodiments are applicable also to other types of magnetoresistive sensors, such as the giant-magnetoresistive (GMR) sensor and tunneling-magnetoresistive (TMR) sensor and other integrated magnetic-field sensors in themselves sensitive to magnetic fields parallel to the chip where they are integrated.

BACKGROUND

As is known, magnetoresistive sensors exploit the capacity of appropriate ferromagnetic materials (called magnetoresistive materials, for example the material known by the name "permalloy", formed by an Fe—Ni alloy) to modify their resistance in the presence of an external magnetic field.

Currently, magnetoresistive sensors are obtained from magnetoresistive material strips. During manufacture, the magnetoresistive material strip can be subjected to an external magnetic field so as to have a preferential magnetization in a preset direction (referred to as the easy axis), for example the longitudinal direction of the strip.

Before measuring the external magnetic field, a state of initial magnetization along the axis of preferential magnetization is imposed via a current pulse through a set/reset strap. In absence of external magnetic fields, the magnetization maintains the direction imposed by the set/reset pulse, and the strip has maximum resistance in this direction. In presence of external magnetic fields having a direction different from that of preferential magnetization, the magnetization of the strip changes, as does its resistance, as explained hereinafter with reference to FIG. 1.

Figures 1, 2:
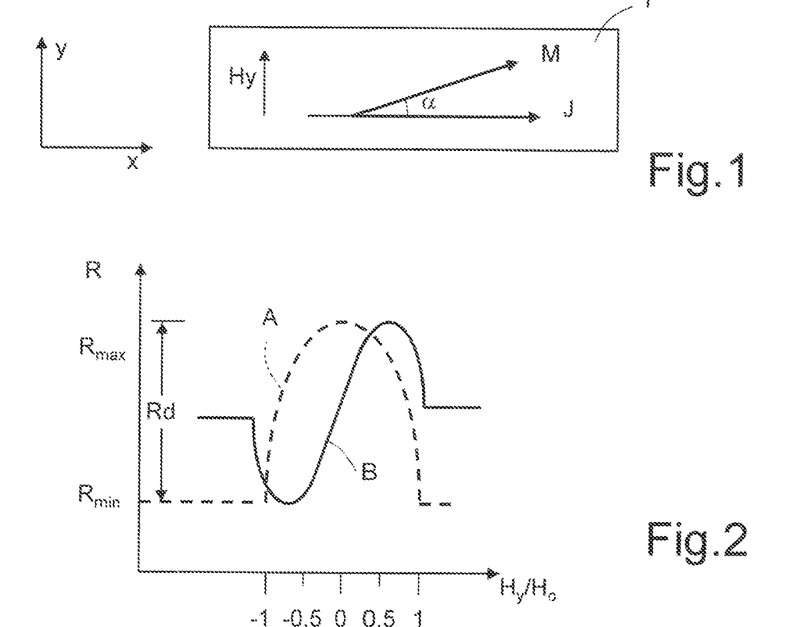
FIG. 1 shows a magnetoresistive element of a known type.
FIG. 2 shows the variation of resistance as a function of the field applied for the elements of FIGS. 1 and 3.

In FIG. 1, a magnetoresistor 1 is formed by a magnetoresistive material strip having a longitudinal direction parallel to the axis X, which forms also the direction of preferential magnetization. The magnetoresistor 1 is traversed by a current I flowing in the longitudinal direction of the strip. An external magnetic field Hy is directed in a parallel direction to the axis Y and causes a rotation of the magnetization M through an angle $\alpha$ with respect to the current I. In this case we have $$R = R_{min} + R_d \cos^2 \alpha$$

where $R_{min}$ is the resistance of the magnetoresistor in case of magnetization M parallel to the axis Y (very high external magnetic field Hy), and $R_d$ is the difference of resistance $R_{max} - R_{min}$, where $R_{max}$ is the resistance in case of magnetization directed in a parallel direction to the direction X.

For permalloy, the maximum ratio $R_d/R$ is in the region of 2-3%.

Setting $$\sin^2 \alpha = \frac{Hy^2}{Ho^2} \text{ for } Hy \leq Ho$$

and $$\sin^2 \alpha = 1 \text{ for } Hy \geq Ho$$

where Ho is a parameter depending upon the material and the geometry of the strip 1, we have:

$$R = R_{min} + R_d \left[1 - \left(\frac{Hy}{Ho}\right)^2\right] \text{ for } Hy \leq Ho \quad (1)$$

FIG. 2 represents with a dashed line the plot of the resistance R resulting from Eq. (1) (curve A).

Figure 3:
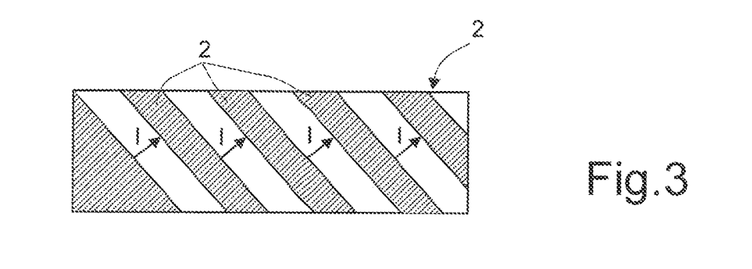
FIG. 3 shows a known different magnetoresistive element.

It is moreover known, in order to linearize the plot of the resistance R at least in an operative portion of the curve, to form, above the magnetoresistive material strip, transversal strips 2 (called "barber poles"), of conductive material (for example aluminum), set at a constant distance and with inclination of 45° with respect to the direction X, as shown in FIG. 3.

In this situation, the direction of the current I changes, but not the magnetization. Consequently, Eq. (1) becomes:

$$R = R_{min} + \frac{R_d}{2} \pm \frac{R_d}{2}\left(\frac{Hy}{Ho}\right)\sqrt{1 - \left(\frac{Hy}{Ho}\right)^2} \text{ for } Hy \leq Ho \quad (2)$$

having a linear characteristic around the point Hy/Ho=0, as shown by the curve B, represented by a solid line in FIG. 2.

In practice, in this neighborhood, the term under the square root is negligible as compared to the linear term and thus we have $$R = R_o \pm k\left(\frac{Hy}{Ho}\right) \quad (3)$$

The ± sign in Eq. (3) depends upon the direction of the transversal strips 2 (±45°).

Figure 4:
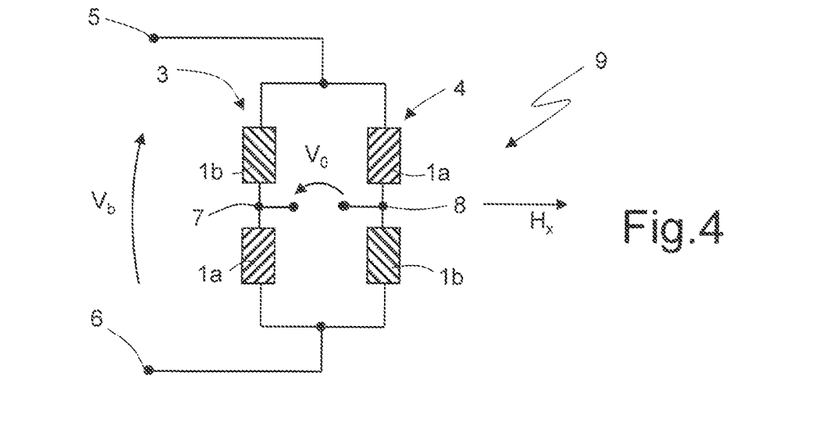
FIG. 4 shows a magnetoresistive sensor in a Wheatstone-bridge configuration.

FIG. 4 shows a magnetoresistive sensor 9 including four magnetoresistors 1 having transversal strips 2 arranged in an alternating way. The magnetoresistors 1 are connected so as to form a Wheatstone bridge formed by two mutually parallel branches 3, 4 defining input terminals 5, 6 and output terminals 7, 8. In detail, in each branch 3, 4, the two magnetoresistors 1a, 1b have transversal strips 2 directed in an opposite direction (+45° and −45°, respectively). The magnetoresistors 1a, 1b of one branch are arranged diametrically opposite to the corresponding ones of the other branches (the magnetoresistor 1a of the first branch 3 with transversal strips 2 at +45° is connected to the second input terminal 6 and the magnetoresistor 1a of the second branch 4 with transversal strips 2 at +45° is connected to the first input terminal 5; the same applies to the magnetoresistors 1b). A biasing voltage Vb is applied between the input terminals 5, 6.

Trimmer resistors can be connected in series to each branch 3, 4, in a way not shown, so that, in absence of an external magnetic field directed in a parallel direction to the direction of detection (here the field Hx), the output voltage Vo across the output terminals 7, 8 is zero. Instead, in case of initial magnetization directed vertically downwards, an external magnetic field Hx causes an increase in the resistivity of the magnetoresistors, here the straps 1a, having transversal strips 2 directed at +45° and a corresponding reduction in the resistivity of the other magnetoresistors 1b having transversal strips 2 directed at −45°. Consequently, each variation of resistance due to an external field perpendicular to the magnetoresistors 1a, 1b causes a corresponding linear variation of the output voltage Vo, the value of which thus depends in a linear way upon the external magnetic field Hx.

Because of the high sensitivity of magnetoresistive sensors of the type referred to above, recently use thereof has been proposed for electronic compasses in navigation systems. In this case, the external field to be detected is represented by the Earth's magnetic field. To a first approximation, the Earth's magnetic field can be considered parallel to the Earth's surface and the reading of the compass thus requires two sensors sensitive to the two directions of the plane locally tangential to the Earth's surface.

Since, however, the inclination of the compass with respect to the tangential plane entails reading errors, to correct these errors three sensors are used, each having a sensitive axis directed according to the three spatial axes X, Y, Z.

Figure 5:
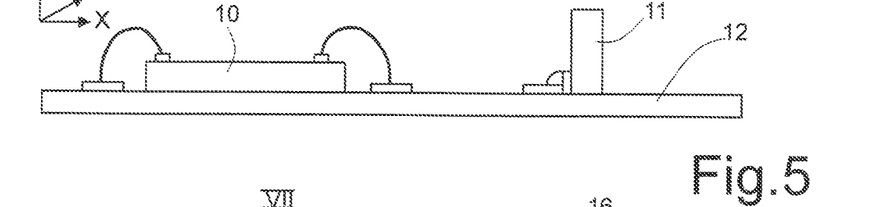
FIG. 5 shows a known arrangement of elementary sensors for the detection of magnetic fields along three Cartesian axes.

To this end, the three sensors are arranged with their sensitive axes positioned 90° with respect to each other. Whereas the production of a sensor sensitive to fields directed in two directions does not create any difficulty, since they lie in the same plane, having the third sensor in the third direction involves a plane perpendicular to that of the first two sensors, as shown in FIG. 5, where the sensors X and Y are integrated in a chip 10 and the sensor Z is integrated in a different chip 11 and the chips 10, 11 are fixed to a same base or frame 12. In fact, in this case, the operations of assembly are much more complex and the finished device is much more costly.

In addition, the alignment tolerances between the sensor Z and the sensors X and Y provided in different chips are greater than in case of sensors integrated in a single chip so that a smaller precision is achieved as regards determination of the direction of the magnetic field, which is fundamental for the applications of an electronic compass.

In addition, with the scaling down of the chips, the packages should be increasingly small (e.g., from 5×5 mm$^2$ to 3×3 mm$^2$); however, vertical assemblage is incompatible with the desired reduction.

The solutions proposed to the problem indicated are not, however, satisfactory. For example, United States Patent Application Publication No. 2009/0027048 (incorporated by reference) describes a manufacturing process wherein a magnetoresistance is deposited in a V-shaped trench so that the sensitive layer is able to detect also part of the component perpendicular to the chip. On the other hand, this solution renders more difficult deposition and definition of the transversal strips or "barber poles", of the metal interconnections, and of the auxiliary straps for calibration and for the set-reset procedure (the so-called "flipping") for reduction of offset.

Similar problems exist also in case of a single sensor for detecting magnetic fields directed perpendicularly to the horizontal plane, when the vertical arrangement of the device including the sensor is not possible or when, even though the aim is to detect the horizontal field components, it is necessary to arrange the device in a vertical position.

SUMMARY

Embodiments provide a magnetoresistive sensor of an integrated type that is able to detect external magnetic fields directed in a transverse direction to the magnetoresistive element plane.

In an embodiment, an integrated magnetoresistive device comprises: a substrate having first and second surfaces, an insulating layer extending on the first surface, a first magnetoresistor of a first ferromagnetic material extending in the insulating layer and having a sensitivity plane, and a concentrator of a second ferromagnetic material including a first arm extending longitudinally in a transversal direction to the sensitivity plane and vertically offset to the first magnetoresistor, the concentrator being configured to deflect magnetic flux lines directed perpendicularly to the sensitivity plane and to generate magnetic field components directed in a parallel direction to the sensitivity plane.

In an embodiment, a process for manufacturing an integrated magnetoresistive device comprises the steps of: forming an insulating layer on top of a first surface of a substrate having first and second surfaces; forming a magnetoresistor of a first ferromagnetic material in the insulating layer, the magnetoresistor defining a sensitivity plane; and forming a concentrator of a second ferromagnetic material including forming a first arm extending longitudinally in a transverse direction to the sensitivity plane and vertically offset with respect to the magnetoresistor.

In an embodiment, a process for manufacturing an integrated magnetoresistive device comprises the steps of: forming an insulating layer on top of a first surface of a substrate having first and second surfaces; forming a magnetoresistor of a first ferromagnetic material within the insulating layer, the magnetoresistor defining a sensitivity plane parallel to the first and second surfaces; opening a trench in the second surface of the substrate; and coating a side wall of said trench with a second ferromagnetic material to form a concentrator having an arm on said side wall that extends longitudinally in a transverse direction to the sensitivity plane, said arm being offset from the magnetoresistor in a direction perpendicular to the first surface.

In an embodiment, a process for manufacturing an integrated magnetoresistive device comprises the steps of: forming an insulating layer on top of a first surface of a substrate having first and second surfaces; forming a magnetoresistor of a first ferromagnetic material within the insulating layer, the magnetoresistor defining a sensitivity plane parallel to the first and second surfaces; opening a trench in the insulating layer; and coating a side wall of said trench with a second ferromagnetic material to form a concentrator having an arm on said side wall that extends longitudinally in a transverse direction to the sensitivity plane, said arm being offset from the magnetoresistor in a direction perpendicular to the first surface.

In an embodiment, a process for manufacturing an integrated magnetoresistive device comprises the steps of: forming an insulating layer on top of a first surface of a substrate having first and second surfaces; forming a magnetoresistor of a first ferromagnetic material within the insulating layer, the magnetoresistor defining a sensitivity plane parallel to the first and second surfaces; opening a trench in an additional substrate; coating a side wall of said trench with a second ferromagnetic material; and attaching the additional substrate to the insulating layer, said second ferrormagnetic material forming a concentrator having an arm on said side wall that extends longitudinally in a transverse direction to the sensitivity plane, said arm being offset from the magnetoresistor in a direction perpendicular to the first surface.

In an embodiment, a process for manufacturing an integrated magnetoresistive device comprises the steps of: opening a trench in a first surface of a substrate having first and second surfaces; coating a side wall of said trench with a second ferromagnetic material; forming an insulating layer on top of the first surface; and forming a magnetoresistor of a first ferromagnetic material within the insulating layer, the magnetoresistor defining a sensitivity plane parallel to the first and second surfaces; said second ferrormagnetic material forming a concentrator having an arm on said side wall that extends longitudinally in a transverse direction to the sensitivity plane, said arm being offset from the magnetoresistor in a direction perpendicular to the first surface.

BRIEF DESCRIPTION OF THE DRAWINGS

The embodiments will now be described, purely by way of non-limiting example, with reference to the attached drawings, wherein.

DETAILED DESCRIPTION

Figure 6:
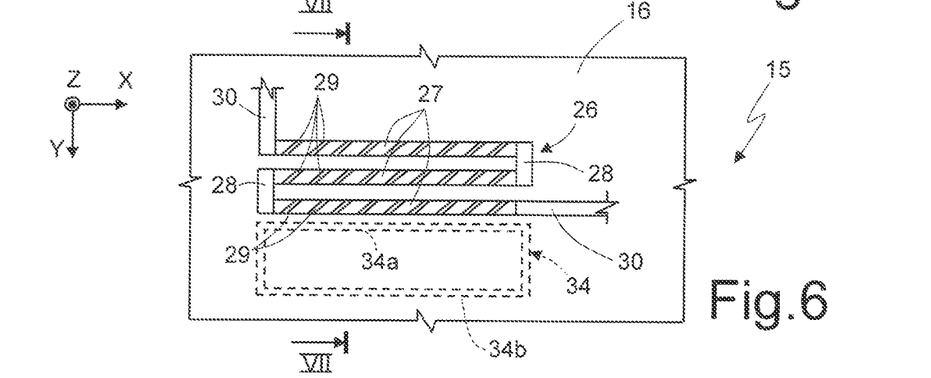
FIG. 6 shows the layout of an embodiment of the present magnetoresistive sensor.
Figure 7:
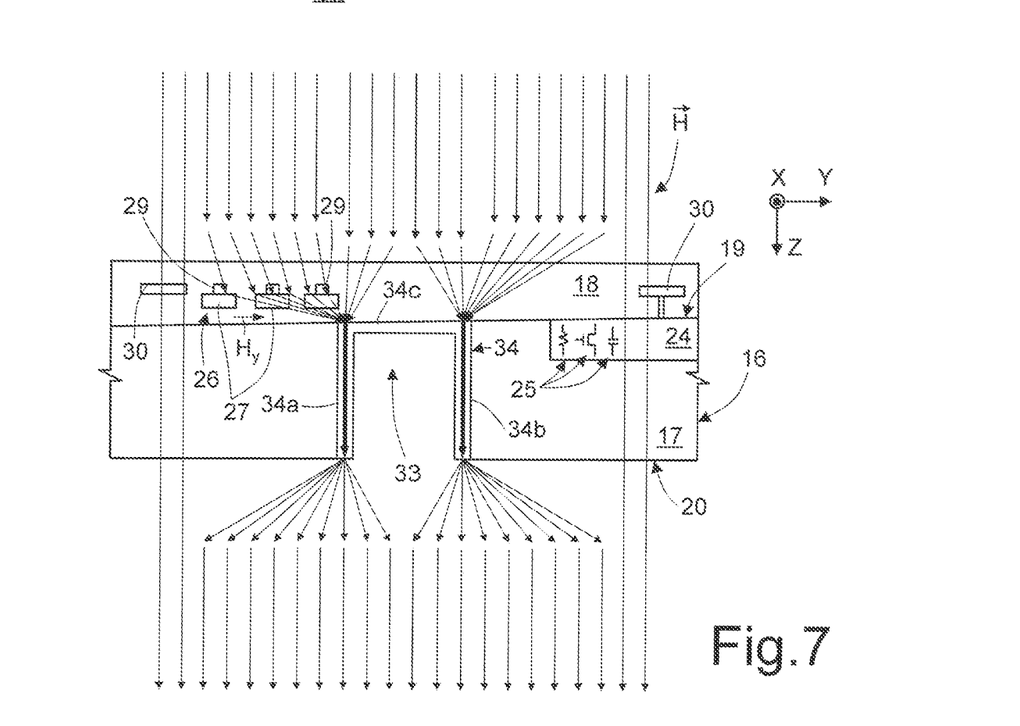
FIG. 7 shows a cross-section through the sensor of FIG. 6.

FIGS. 6 and 7 show a magnetoresistive sensor 15 formed in a chip 16 comprising a substrate 17 of conductive material, for example silicon, and an insulating layer 18, for example, of silicon oxide, typically including a plurality of layers arranged on top of each other. The substrate 17 has a front surface 19 covered by the insulating layer 18 and a rear surface (back) 20. The front surface 19 and the rear surface 20 extend parallel to the plane XY. At least one active area 24 may be present within the substrate 17 and may accommodate electronic components 25, shown only schematically.

The insulating layer 18 accommodates a magnetoresistor 26, for example an anisotropic magnetoresistor AMR, of a planar type, extending parallel to the plane XY and to the surfaces 19, 20 and thus defines a sensitivity plane. In the example illustrated, the magnetoresistor 26 is formed by a plurality of magnetoresistive strips 27, for example of permalloy (Ni/Fe), connected at the ends by connection portions 28 so as to form a serpentine shape. Transversal strips 29 and connection lines 30 are formed on top of the magnetoresistive strips 27; the transversal strips 29 (called "barber poles") are of conductive material (for example aluminum), and the connection lines 30 connect the magnetoresistor 26 and the electronic components 25 together and to the outside of the magnetoresistor. Here, the transversal strips 29, the connection portions 28, and the connection lines 30 are formed in a same metal level. In addition, other metal levels may be provided, connected together by metal vias, in a per se known manner and not shown. A trench or cavity 33 extends within the substrate 17, from the rear surface 20 up to next or even as far as the front surface 19. The trench 33 is arranged laterally offset to the magnetoresistor 26 and accommodates a concentrator 34 formed by a ferromagnetic material layer covering the sides and the bottom of the trench 33. The concentrator 34 is of a "soft" ferromagnetic material (i.e., one that can be magnetized easily and does not maintain the magnetization after the external magnetic field has been removed). For example, a cobalt amorphous alloy or a permalloy can be used that is typically not anisotropic, or at least with the easy axis not aligned to the vertical wall (axis Z).

In the cross-section of FIG. 7, the concentrator 34 has a U shape and comprises two arms 34a, 34b and a base 34c. The arms 34a, 34b cover, and extend contiguous to, the lateral walls of the trench 33, throughout the depth of the trench 33 (in the case shown, throughout the thickness of the substrate 17); the base 34c covers, and is contiguous to, the bottom of the trench 33 and thus is here flush with the top surface 19 of the substrate 17. As discussed below, the arms 34a, 34b have a principal dimension along the axis Z much greater than their thickness. As may be noted, both of the arms 34a, 34b are vertically offset to all the magnetoresistive strips 27.

Consequently, as represented in FIG. 7, which regards a cross-section in the plane Y-Z, when the sensor 15 is subject to an external magnetic field H directed along the axis Z, the arms 34a, 34b of the concentrator 34 cause deflection of the field lines H and generation of a horizontal field component Hy directed along the axis Y and thus parallel to the sensitivity plane. The horizontal component Hy (and precisely that generated as a result of the arm 34a) can thus be detected by the magnetoresistor 26 by means of an external reading circuit in a known manner, since it causes a change of the magnetization of the magnetoresistive strips 27 and thus of the resistance of the magnetoresistor 26.

In addition, since both the magnetoresistor 26 and the concentrator 34 are of ferromagnetic material, a magnetic circuit is created that favors the concentration effect of the magnetic field and thus bestows high sensitivity on the sensor 15.

Figure 8:
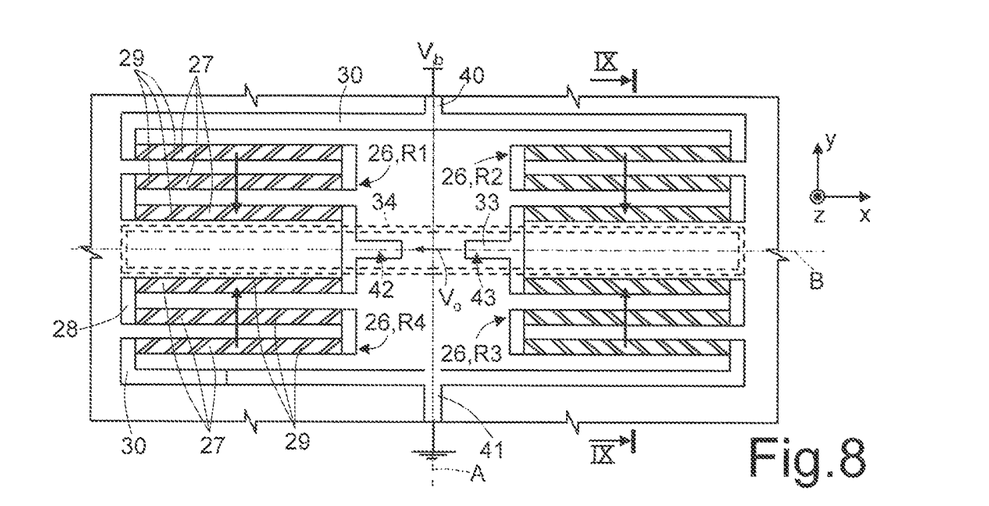
FIG. 8 shows the layout of a different implementation of the present sensor.
Figure 9:
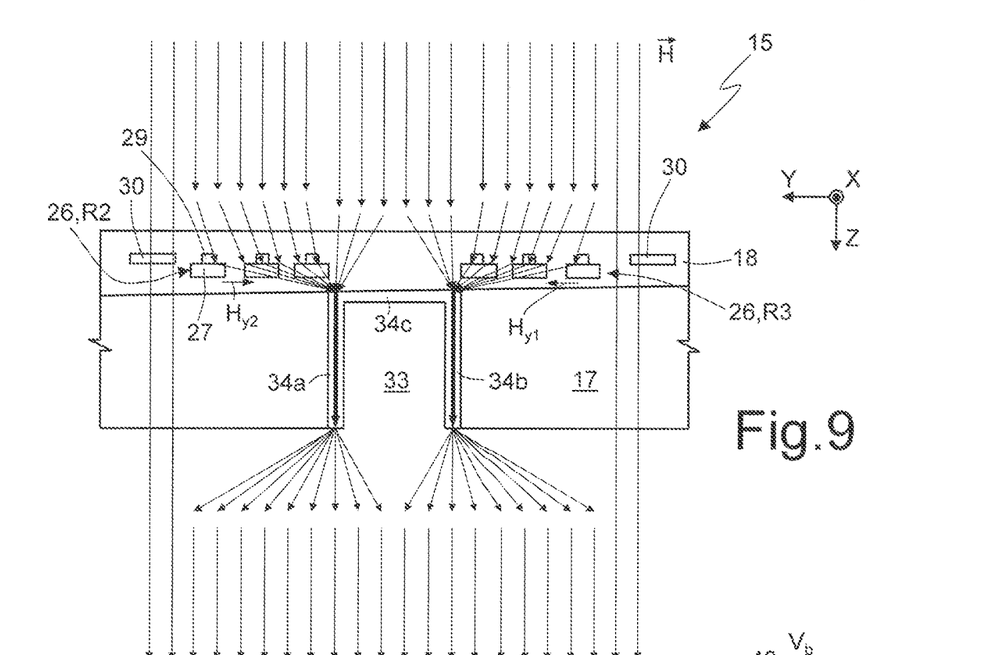
FIG. 9 shows a cross-section of the sensor of FIG. 8.
Figure 10:
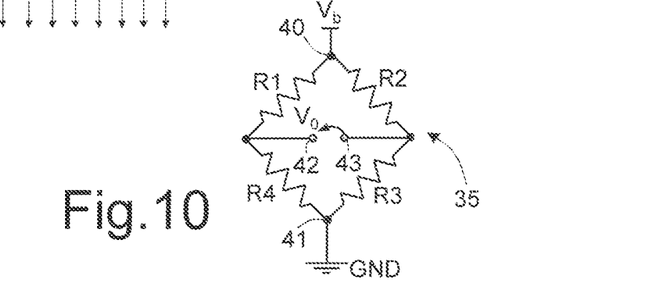
FIG. 10 shows the equivalent electrical circuit of the sensor of FIGS. 8 and 9.

FIGS. 8-10 show an embodiment of the magnetoresistive sensor 15 that is insensitive to magnetic fields directed in a parallel direction to the plane XY.

In detail, FIGS. 8 and 9 (in which parts corresponding to the sensor of FIGS. 6, 7 have the same reference numbers) comprises four magnetoresistors 26 that form, respectively, resistors R1-R4, which are coplanar and are connected so as to form a Wheatstone bridge 35 (FIG. 10). To this end, the connection lines 30 connect first terminals of the resistors R1, R2 to each other and to a supply input 40 of the bridge 35; first terminals of the resistors R3, R4 to each other and to a grounding input 41; second terminals of the resistors R1, R4 to a first output terminal 42; and second terminals of the resistors R2, R3 to a second output terminal 43. In practice, the resistors R1 and R4 form a first branch of the bridge 35, and the resistors R2 and R3 form a second branch of the bridge 35, and the two branches are connected in parallel to each other and between the inputs 40 and 41, according to the equivalent electrical circuit of FIG. 10.

The resistors R1-R4 are the same as each other as regards the geometrical and electrical characteristics of the magnetoresistive strips 27 and of the connection portions 28, but have transversal strips 29 inclined by ±45° with respect to the axis X. In particular, in the example shown, the resistors R1-R4 are arranged symmetrically with respect to an axis A parallel to the axis Y, where the resistors R1, R4 of the first branch of the bridge 35 have transversal strips 29 directed at +45° with respect to the axis X and are arranged symmetrically with respect to the resistors R2, R3 of the second branch of the bridge 35, having transversal strips 29 directed at −45° (+135°) with respect to the axis X. In addition, the resistors R1-R4 are arranged symmetrically (apart from the direction of the transversal strips 29) about an axis B parallel to the axis X. For the rest, each resistor R1-R4 is obtained in the way described for the magnetoresistor 26 with reference to FIGS. 6, 7.

In the example considered, the concentrator 34 extends longitudinally and symmetrically with respect to the axis B so as to have the resistors R1, R2 on a first side thereof and the resistors R3, R4 on the opposite side. In addition (FIG. 9), the concentrator 34 extends between the pairs of resistors R1-R2 and R3-R4 so that the surfaces external to the U of the arms 34a, 34b are substantially aligned (but for tolerances) to the edges of the magnetoresistive strips 27 that face the axis B. In general, however, the arms 34a, 34b can be arranged at a distance from the resistors R1-R4 (along the axis Y); however, this distance is appropriately reduced and in any case kept less than 5 µm at worst.

With the configuration of FIG. 8, the arms 34a, 34b focus the magnetic flow so as to deflect the lines of magnetic flow and create field components parallel to the axis Y but with opposite directions, since they are guided through the ferromagnetic material of the magnetoresistors 26, following the path with minimum reluctance. Consequently, in the example of FIG. 9 with external magnetic field H directed in a direction Z and initial magnetization in a direction −X, the resistors R3, R4 beneath (in FIG. 9) the concentrator 34 see a positive field component Hy1, and the resistors R1, R2 above the concentrator 34 see a negative field component Hy2, where Hy2=−Hy1. Thus, because of the different direction of the transversal strips 29, on the basis of Eq. (3), the resistance of the resistors R1, R3 decreases by ΔR, whereas the resistance of the resistors R2, R4 increases by ΔR. It follows that the output voltage Vo between the outputs 42 and 43 is $$Vo=Vb\Delta R/Ro$$

i.e., proportional to the resistance variation and thus to the external magnetic field H. Consequently, a purposely provided reading circuit, on the basis of the signal detected and of the geometrical configuration, is able to determine the amplitude of the external magnetic field H.

Instead, if the external magnetic field is of opposite sign, an output voltage $$Vo=-Vb\Delta R/Ro$$

is obtained, with opposite sign with respect to the previous one.

On the other hand, a possible magnetic field directed along the axis Y (for example, of positive sign) causes a same resistance change (e.g., +ΔR) in the resistors R1 and R4, since they detect the same component and have transversal strips 29 directed in the same direction. In addition, this field along the axis Y causes an equal resistance change, but with opposite sign (e.g., −ΔR), in the resistors R2 and R3. It follows that the output voltage Vo remains zero.

The sensor 15 of FIGS. 8, 9 is obtained as described hereinafter.

Figure 11A:
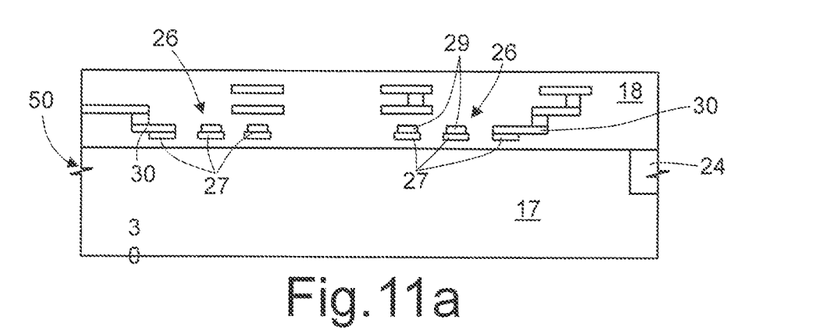
FIGS. 11a-11d are cross-sections through a wafer of semiconductor material in successive steps of fabrication of the sensor of FIGS. 8 and 9.

Initially (FIG. 11a), a wafer 50 comprising the substrate 17, for example of silicon, is subjected to the usual steps for forming the components 25 (not shown in FIG. 11a) within the active area 24. Then, after depositing a thin insulating layer (not shown separately) on the top surface 19, the magnetoresistors 26 are formed with known techniques. For example, by means of a resist deposition and a standard photolithography, a resist mask for the resistors is formed that covers the entire wafer except for windows where the magnetoresistive strips 27 are to be provided. Then, a thin film of magnetoresistive material, for example permalloy, is deposited, the resist mask for the resistors is dissolved via solvents, and the metal above the resist mask is removed (lift-off technique), thus forming the magnetoresistive strips 27. Alternatively, it is possible to use dry or wet etching techniques. Next, a metal layer, for example of aluminum or copper, is deposited and defined, to form the transversal strips (barber poles) 29, the connection portions 28, and the interconnection lines 30. In this metal layer, possible trimmer resistors can be formed, as well as the set/reset strap for reducing the offset and possibly the calibration strap. Next, at least one dielectric layer (or more than one, if various metal levels are required) is deposited, thus completing the insulating layer 18.

Then (FIG. 11b), the trench 33 is formed from the bottom surface 20 of the substrate. The trench 33 can be formed, for example, by means of a deep reactive ion etch (DRIE). In the example illustrated, the trench 33 has vertical lateral walls, perpendicular to the rear surface 20, but it is also possible to provide a trench with inclined walls so as to form an angle of less than 90°, as represented with a dashed line on the right in FIG. 11b.

Figure 11B:
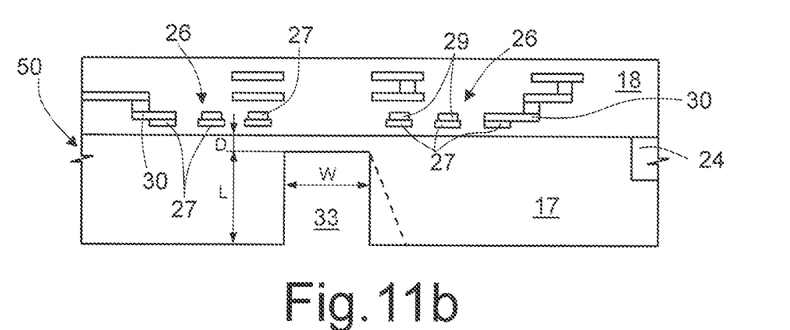

The trench 33 can have a length equal to the thickness of the substrate 17 or slightly smaller; for example, the length L can be greater than 50 µm, typically L=300 µm or 500 µm.

If the trench 33 does not extend through the entire thickness of the substrate 17, the distance D between the bottom of the trench 33 and the top surface 19 of the substrate (and, to a first approximation, between the bottom of the trench 33 and the magnetoresistive strips 27, given the thinness of the insulating layer underneath these) is kept as small as possible, e.g., smaller than 30 µm, typically 0.5-10 µm. In fact, the smaller the distance D, the greater the sensitivity of the sensor, since the gap between the concentrator 34 and the magnetoresistors 26 represents an interruption of the magnetic circuit where loss of some lines of flow may occur.

The width W of the trench 33 depends upon the aspect ratios that can be obtained with the used etching process. For example, with an aspect ratio 1:20, in case of L=400 µm, W=20 µm; in case of L=500 W=25 µm. In case of aspect ratio L/t=1:10, the minimum width may be equal to 12.5 µm. In one embodiment, the width W can be approximately equal to the distance between the mutually facing sides of two magnetoresistors 26 arranged symmetrically with respect to the axis B.

Next (FIG. 11c), a ferromagnetic layer 52 is deposited on the bottom surface 20, for example by sputtering, and covers the lateral walls and the bottom wall of the trench 33. The ferromagnetic layer 52 is of a soft ferromagnetic material, preferably a cobalt amorphous alloy or permalloy, and may have a thickness comprised between 0.5 µm and 3 µm, for example 1 µm. If obtained by plating, the ferromagnetic layer 52 may have a larger thickness, for example of up to 10 µm.

Next (FIG. 11d), the ferromagnetic layer 52 is defined, for example, via wet etching or alternatively by dry etching or lift-off so as to remove it from the bottom surface 20 of the substrate 17 and form the concentrator 34. Then, the wafer 50 is diced, thus obtaining a plurality of chips 16.

Figure 12:
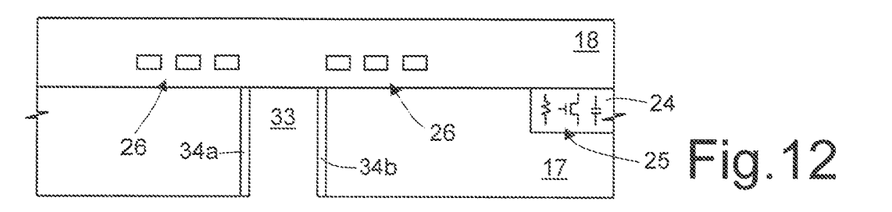
FIGS. 12 and 13 are schematic illustrations of two possible variants of the present sensor.
Figure 13:
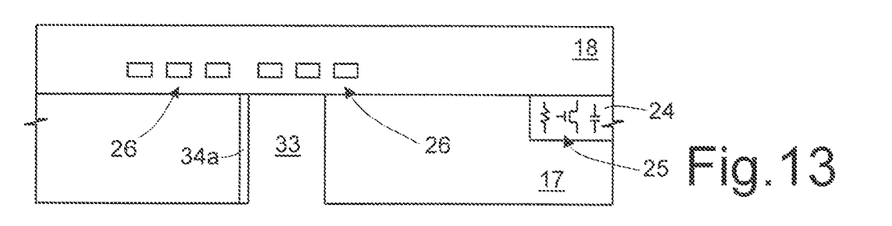

As an alternative to the above, the base 34c of the concentrator 34 can be removed (FIG. 12) since the part useful for concentration of the magnetic field and for closing the magnetic circuit is represented by the arms 34a, 34b. It is moreover possible to remove also one of the two arms, for example the arm 34b, as shown in FIG. 12. In this case, the remaining arm 34a is positioned symmetrically with respect to the magnetoresistors 26, and the magnetoresistors 26 on opposite branches of the bridge 35 (FIG. 8) can be brought up closer to each other; for example, they can be arranged at a distance linked to the process and to the thickness of the layer that forms the concentrator 34. For instance, in the case of a front-back misalignment of 5 µm, the magnetoresistors 26 can brought up to each other to a distance of approximately 10 µm, but in the case of a process with lower tolerances, also the distance between the magnetoresistors 26 can be further reduced, enabling a saving of area.

The sensor 15 with the concentrator 34 thus forms a magnetic circuit bending an external magnetic field directed perpendicularly (or having a component directed perpendicularly) to the magnetoresistors 26 so as to generate parallel components that can be detected by the magnetoresistors. In addition, it concentrates the magnetic flow, increasing the sensitivity of the sensor. With the single-element solution of FIGS. 6-7, the magnetoresistor 26 remains sensitive to the magnetic fields parallel to the sensor 15 so that the single-element solution can typically be used in applications in which only perpendicular fields exist; instead, using the bridge solution 35 of FIGS. 8-9 it is possible to eliminate external-field components parallel to the sensor.

By integrating, moreover, known magnetoresistive sensors 9 in the same chip 16 with the sensor 15, it is possible to obtain a three-axis AMR, GMR or TMR device having improved precision as compared to non-integrated solutions, thanks to the reduction of mismatch of the magnetoresistors 26.

In addition, a saving of area and greater compactness of the three-axis sensor is achieved.

The assembly of a single sensor Z sensitive to perpendicular fields or of the three-axis sensor moreover proves considerably simplified as compared to the case of vertical assembly, as was necessary hitherto.

The concentrator is provided in a step of post-machining as compared to a standard AMR sensor and thus does not jeopardize or affect the manufacture of the others components of the sensor, including electronic components integrated in the same chip for processing the signal supplied by the magnetic sensor, thus not deteriorating substantially the reliability of the associated integrated circuits.

FEM (Finite Element Method) simulations conducted by the applicant have in effect shown that the sensor 15 has a sensitivity along the axis Z equal to or even greater than the sensitivity of the known sensor of FIG. 4, if assembled in a vertical direction, with a same area or even a reduction of the integration area.

Using the sensor 15 it is possible to provide a three-axis sensor for electronic-compass applications.

Figure 14:
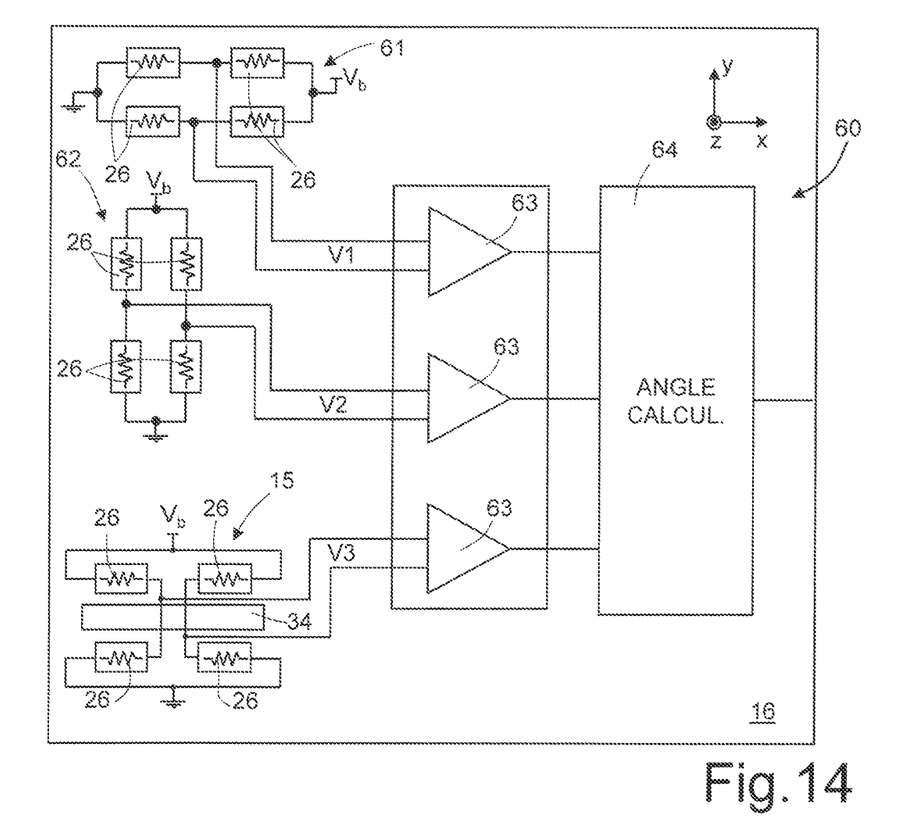
FIG. 14 shows the block diagram of an electronic compass using the present magnetoresistive sensor.

For example, an electronic compass 60 can be obtained in a single chip 16 by integrating two magnetoresistive sensors X and Y of a known type, without concentrator, rotated with respect to each other through 90°, alongside the sensor 15, as shown in FIG. 14.

Here, the electronic compass 60 comprises a first magnetoresistive sensor 61, detecting field components parallel to the axis X, a second magnetoresistive sensor 62, detecting field components parallel to the axis Y, and the present magnetoresistive sensor 15 (the magnetoresistors 26 of which are provided with a concentrator), detecting field components parallel to the axis Z. Each of the magnetoresistive sensors 61, 62 and 15 is connected to an own amplifier stage 63, which also eliminates the offset, and then to a calculation stage 64 determining the direction of the magnetic field in a per se known manner.

Figure 15:
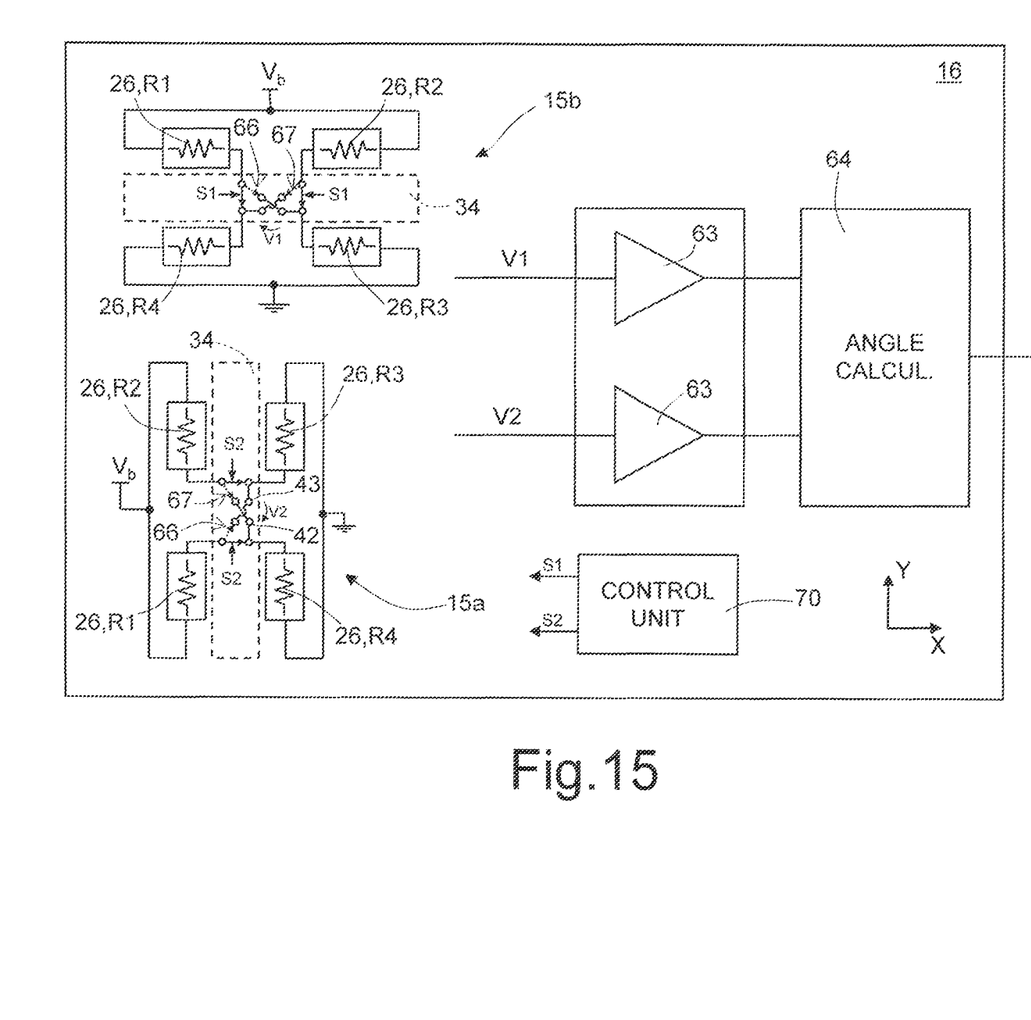
FIG. 15 shows another embodiment of an electronic compass.

Alternatively, it is possible to use just two magnetoresistive sensors, of which at least one is built like the present magnetoresistive sensor 15 provided with a concentrator, and moreover use a system of switches for changing the configuration of the bridge. For example, FIG. 15 shows an embodiment with two magnetoresistive sensors 15a, 15b, rotated through 90° with respect to each other. Each magnetoresistive sensor 15a, 15b comprises a first switch 66 arranged between the first resistor R1 and the first output terminal 42; and a second switch 67 arranged between the second resistor R2 and the second output terminal 43. In particular, the first switch 66 has two positions: a first position in which the first switch 66 connects the first resistor R1 to the first output terminal 42; and a second position, in which it connects the first resistor R1 to the second output terminal 43. Likewise, the second switch 67 has two positions: a first position, in which the second switch 67 connects the second resistor R2 to the second output terminal 43; and a second position in which it connects the first resistor R1 to the first output terminal 42.

Figure 16:
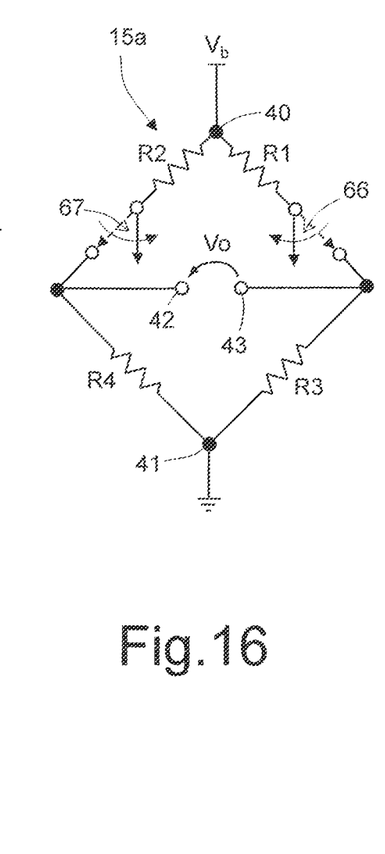
FIG. 16 shows the equivalent electrical circuit of the magnetoresistive sensors implemented in the electronic compass of FIG. 15, in an operative condition.

The switches 66, 67 of the first magnetoresistive sensor 15a are controlled by a same signal s1, and the switches 66, 67 of the second magnetoresistive sensor 15b are controlled by a same signal s2, so that the two magnetoresistive sensors 15a, 15b can be controlled independently. In this way, when the switches 66, 67 are in the first position, the corresponding magnetoresistive sensor 15a, 15b operates in the way described above with reference to FIGS. 8-10, detecting the component Z of an external field, whereas when the switches 66, 67 are in the second position (and thus the magnetoresistive sensors 15a, 15b have the equivalent electrical circuit shown in FIG. 16), each magnetoresistive sensor 15a, 15b measures the respective planar component (X and Y), being insensitive to the field component along the axis Z.

In this way, a purposely provided control stage 70 integrated in the chip 16 can control the switches 66, 67 through the signals s1, s2 for acquiring first the planar components (X, Y) and then the perpendicular components (Z), or vice versa or with any desired sequence.

Obviously, in the solution provided with switches 66, 67, the arrangement of the transversal strips 29 of the resistors R1, R2 of the magnetoresistive sensor 15a and/or 15b can be exchanged so that in this sensor the magnetoresistors 26 is symmetrical with respect to the axis B, instead of the axis A. In this case, in practice, the first branch of the bridge would be formed by the magnetoresistors R2 and R4, and the second branch of the bridge would be formed by the magnetoresistors R1 and R3. Consequently, with the arrangement of the switches 66, 67 represented with a solid line in FIG. 15, the magnetoresistive sensors 15a, 15b detect components of magnetic field directed, respectively, parallel to the axis X and to the axis Y and are able to detect components of magnetic field directed in a parallel direction to the axis Z when the switches 66, 67 are in the position represented by the dashed line.

In addition, as has been mentioned, just one of the two magnetoresistive sensors 15a, 15b may be provided (detecting alternatively the direction Z and one direction between X and Y) and the others being provided without concentrator and without switches but being rotated through 90° so as to detect the other between the directions X and Y.

Finally, it is clear that modifications and variations may be made to the sensor described and illustrated herein, without thereby departing from the scope of the present invention, as defined in the annexed claims.

For example, the magnetoresistors 26 can be provided in a different way, by a single segment or by shaping the ferromagnetic material so as to already have a serpentine shape; more than four magnetoresistors may be used, and/or more than one concentrator could be provided; for example, another set of magnetoresistors 26 with an own concentrator 34 could be arranged alongside the elements shown in FIG. 9. In this case, the sets of magnetoresistors-concentrators would have to be arranged at a distance such as not to influence each other and could be connected so as to form in any case a Wheatstone bridge 35, the resistors R1-R4 whereof are formed by pairs of resistors 26 connected in series. In this case, since the magnetic field concentrated on the magnetoresistive strips 27 making up each magnetoresistor 26 decreases sensibly with the distance thereof from the edge of the concentrator 34, by dividing each magnetoresistor 26 into a number of parts, it is possible to increase the sensitivity at the expense of a greater occupation of area.

Figure 11C:
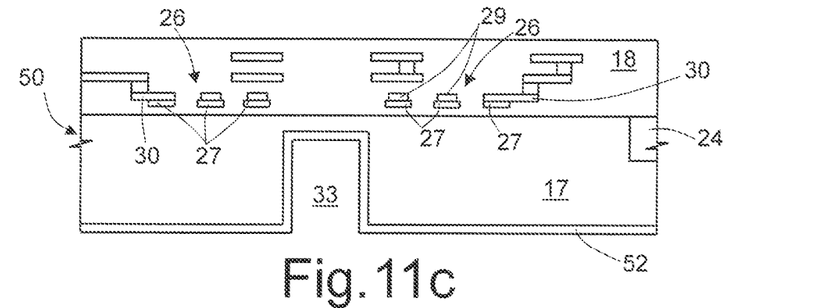
Figure 11D:
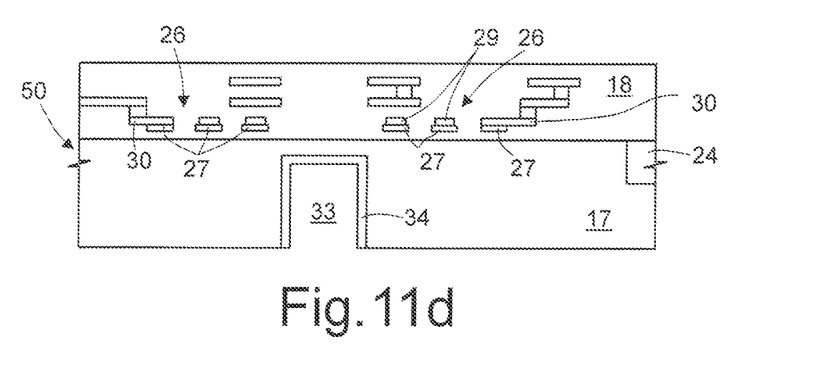

In addition, the concentrator could be provided on the front of the chip, for example in a different chip bonded to the insulating layer 18. Such a solution is e.g. shown in FIG. 17, wherein a second substrate 120 of conductive material, for example silicon, has been bonded to the first substrate 117 through bumps 110. The second substrate 120 has a trench 133 facing the insulating layer 118 of the first substrate 117 and a concentrator 134, of a ferromagnetic material layer, covers the sides and the bottom of the trench 133, analogously to the concentrator 34 of FIG. 9. In this case, the first and second substrates 117, 120 are worked independently to form the active area 24 and any components in the first substrate 117 and to form the concentrator 134 in the second substrate 120. To this end, the steps described with reference to FIGS. 11b-11d are performed on the second substrate 120 before bonding. Then, the second substrate 120 is bonded to the first substrate 117, so have the concentrator 134 laterally offset to the magnetoresistor 26 and facing the insulating layer 118 of the first substrate 117.

Figure 17:
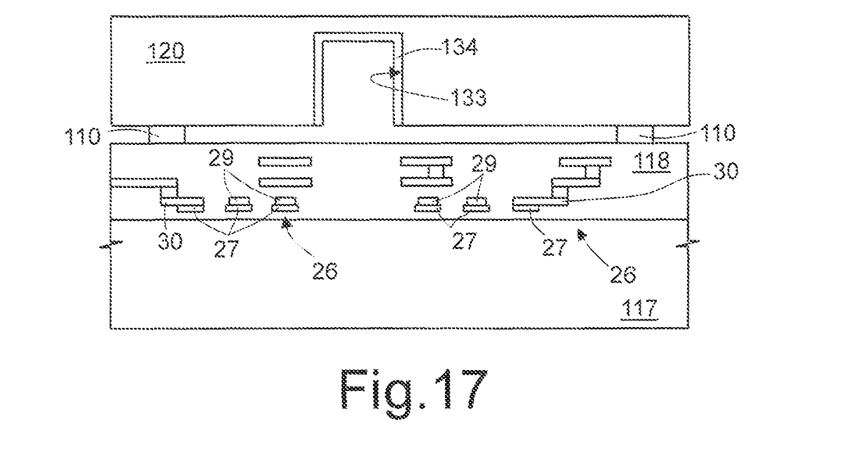
FIG. 17 is a cross-section of another embodiment of the present sensor.

The solution of FIG. 17 may allow a better alignment of the concentrator 134 and does not require post-processing steps.

Figure 18:
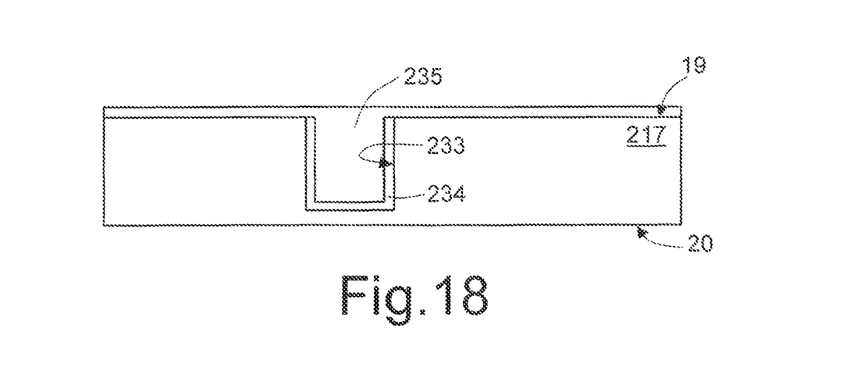
FIGS. 18 and 19 are cross-sections through wafers of semiconductor material in successive steps of fabrication of the sensor according to a different embodiment.
Figure 19:
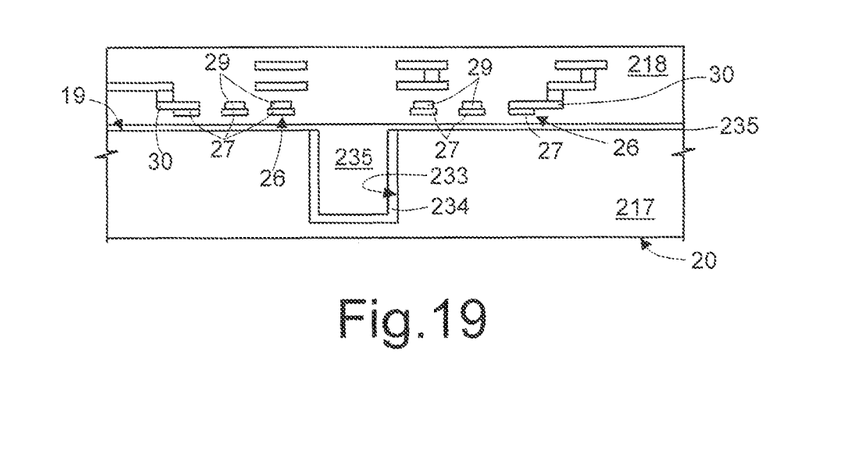

According to another embodiment, the trench and the concentrator are formed before forming the insulating layer and the magnetoresistor from the top surface 19. An embodiment of such a solution is shown in FIGS. 18, 19. In this case, see FIG. 18, the first substrate 217 is etched so as to form a trench 233, the trench 233 is coated with a ferromagnetic layer, which is then defined to form a concentrator 234, analogously to what described with reference to FIGS. 11a-11d. If not completely filled by the ferromagnetic layer, the trench 233 is here filled by an insulating layer 235. Then, FIG. 19, the magnetoresistors 26 and the connection lines 30 are formed and the insulating layer 218 is completed, as described above.

Figure 20:
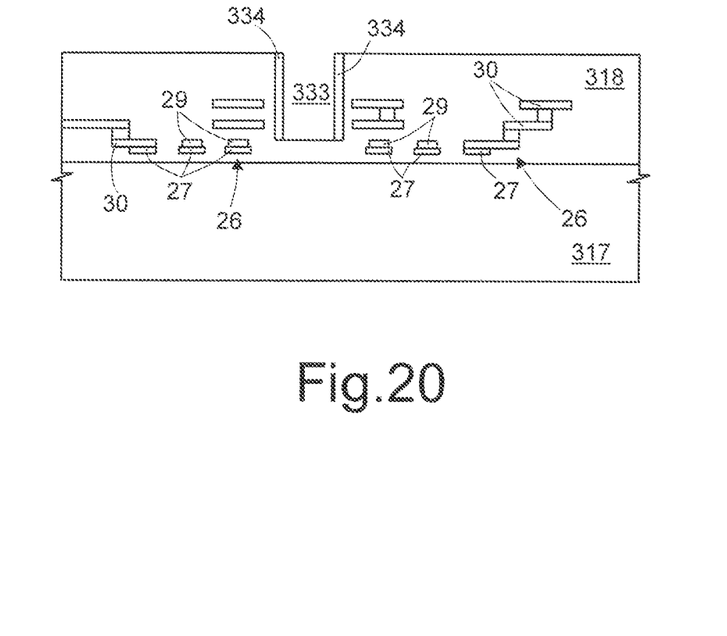
FIGS. 20 and 21 are cross-sections of yet other embodiments of the present sensor.

In yet another embodiment, shown in FIG. 20, the concentrator is formed in the insulating layer. In this case, after forming the magnetoresistors 26 and the connection lines 30 and completing the insulating layer 318, the latter is etched to form a trench 333, a ferromagnetic layer is deposited and defined to form a concentrator 334 (here in the shape of two arms, analogously to FIG. 12. In practice, the arms of the concentrator 334 extend from the free surface of the insulating layer 318 down to in proximity of the magnetoresistors 26. The layout is the same of FIG. 8, as for the embodiments of FIGS. 17-19.

This solution has low manufacturing costs and good alignment characteristics.

Figure 21:
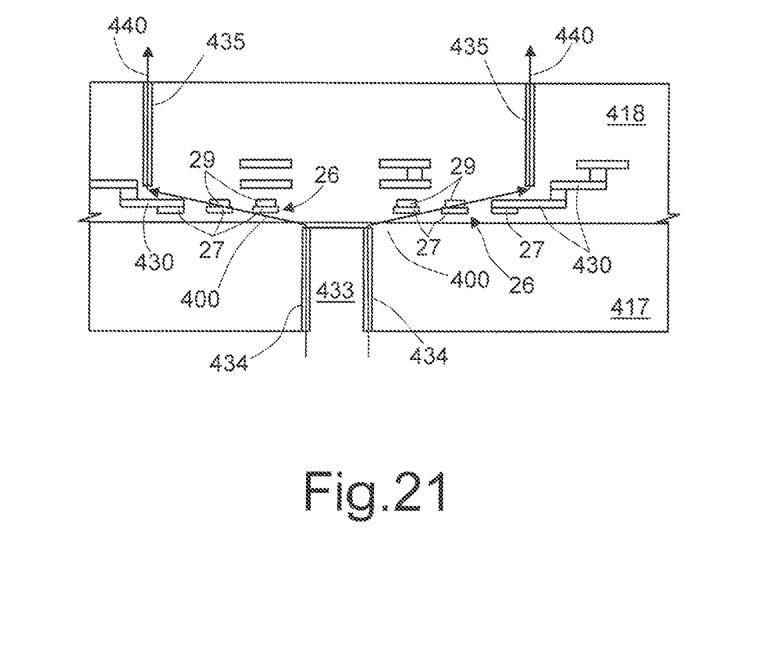

In FIG. 21, a first concentrator 434 is formed in the substrate 417, and second concentrators 435 are formed in the insulating layer 418. In this case, the first concentrator 434 is the same as the concentrator 34 of FIG. 12, including two arms within a trench 433 to and arranged symmetrically to the magnetoresistors 26. The second concentrators 435 extend from the free surface of the insulating layer 418 down to next to the magnetoresistors 26, symmetrically thereto, at the external border thereof.

In FIG. 21, the second concentrators may be obtained by forming thin trenches in the insulating layer 418 and filling them with soft ferromagnetic material, that may be the same of the first concentrator 434.

In this way, as shown by the arrows 400, the magnetic lines are better guided in the horizontal direction in the area of the magnetoresistors 26 and are collected by the second concentrators 435, ensuring a better concentration of the magnetic field, thus increasing the efficiency of the system.

This same solution could be applied to the embodiment of FIGS. 7, 9, 13, and 19. Additionally, second concentrators may be formed in the first substrate 117 of FIG. 17 or in the substrate 317 of FIG. 20.

As has been mentioned, the walls of the trench 33 could be inclined, by even as much as 45°.

In addition, the solution of FIG. 15, with sensors 15a, 15b provided with switches 66, 67 can also be used for three-dimensional devices for detecting magnetic fields with different applications.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

Such alterations, modifications, and improvements are intended to be within the spirit and scope of the invention. Accordingly, the foregoing description is by way of example only and is not intended as limiting. The invention is limited only as defined in the following claims and the equivalents thereto.

The invention claimed is:

1. A process for manufacturing an integrated magnetoresistive device, comprising the steps of:

producing a first structure by:

forming an insulating layer on top of a first surface of a first substrate having first and second surfaces; and forming a magnetoresistor of a first ferromagnetic material within the insulating layer, the magnetoresistor defining a sensitivity plane parallel to the first and second surfaces;

producing a second structure independently of the first structure by:

opening a trench in a second substrate; and coating a side wall of said trench with a second ferromagnetic material; and mounting the second structure to the first structure by:

attaching the second substrate of the second structure to the insulating layer of the first structure, said second ferromagnetic material forming a concentrator having an arm on said side wall that extends longitudinally in a transverse direction to the sensitivity plane, said arm being offset from the magnetoresistor in a direction perpendicular to the first surface.

2. The process of claim 1, wherein an open end of said trench faces the insulating layer.

3. The process of claim 1, wherein said second substrate is made of a conductive material.

4. The process of claim 1, wherein said second substrate is made of a semiconductor material.

5. The process of claim 1, wherein mounting comprises using bumps to attach the second substrate to the insulating layer.

* * * * *